United States Patent
Zhou et al.

(10) Patent No.: US 6,530,380 B1
(45) Date of Patent: Mar. 11, 2003

(54) METHOD FOR SELECTIVE OXIDE ETCHING IN PRE-METAL DEPOSITION

(75) Inventors: Mei Sheng Zhou, Singapore (SG); Vincent Sih, Singapore (SG); Simon Chooi, Singapore (SG); Zainab Bte Ismail, Singapore (SG); Ping Yu Ee, Singapore (SG); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/443,428

(22) Filed: Nov. 19, 1999

(51) Int. Cl.[7] ............................................. H01L 21/302
(52) U.S. Cl. .................. 134/1.2; 134/1.3; 438/723; 438/719; 438/734; 438/704; 438/706; 438/750; 438/756
(58) Field of Search .................. 134/1.2, 1.3; 438/723, 438/734, 704, 706, 719, 750, 756

(56) References Cited

U.S. PATENT DOCUMENTS

| | | | |
|---|---|---|---|
| 5,573,980 A | 11/1996 | Yoo ............................. | 437/200 |
| 5,744,395 A | * 4/1998 | Shue et al. .................. | 438/305 |
| 5,780,349 A | 7/1998 | Naem ........................... | 438/305 |
| 5,863,820 A | 1/1999 | Huang ......................... | 438/241 |
| 5,869,396 A | 2/1999 | Pan et al. ................... | 438/647 |
| 6,025,267 A | * 2/2000 | Pey et al. .................... | 438/656 |

OTHER PUBLICATIONS

"A Simple And Efficient Pretreatment Technology For Selective Tungsten Deposition In Low Pressure Chemical Vapor Deposition Reactor"; Jpn J. Appl. Phys., Part 1 (1994), 33(12 B), pp 7071–7075.*

* cited by examiner

Primary Examiner—George Goudreau
(74) Attorney, Agent, or Firm—George O. Saile; Rosemary L. S. Pike; Stephen G. Stanton

(57) ABSTRACT

A method for completely removing dielectric layers formed selectively upon a substrate employed within a microelectronics fabrication from regions wherein closely spaced structures such as self-aligned metal silicide (or salicide) electrical contacts may be fabricated, with improved properties and with attenuated degradation. There is first provided a substrate with employed within a microelectronics fabrication having formed thereon patterned microelectronics layers with closely spaced features. There is then formed a salicide block layer employing silicon oxide dielectric material which may be selectively doped. There is then formed over the substrate a patterned photoresist etch mask layer. There is then etched the pattern of the patterned photoresist etch mask layer employing dry plasma reactive ion etching. An anhydrous etching environment is then employed to completely remove the silicon oxide dielectric salicide block layer with attenuated degradation of the microelectronics fabrication.

13 Claims, 2 Drawing Sheets

METHOD FOR SELECTIVE OXIDE ETCHING IN PRE-METAL DEPOSITION

BACKGROUND OF THE INVENTION

1. Field of the Invention

The invention relates to the field of microelectronics fabrication. More particularly, the invention relates to the removal of dielectric material during fabrication of closely spaced structures employed in microelectronics fabrications.

2. Description of the Related Art

Microelectronics fabrications employ layers of microelectronics materials formed over substrates and patterned to embody the active devices and other components which are interconnected to form the circuitry of microelectronics fabrications. The formation of low resistance electrical contacts is an important factor in achieving the desired circuit performance in such microelectronics fabrications. Increased density of components employed within microelectronics fabrications has resulted in closer spacing between the structures which constitute the components such as low resistance electrical contacts among others.

Electrical contacts may be formed employing metal silicide compound conductor materials which have low electrical resistance. When such silicide materials are employed in microelectronics fabrications in such a fashion as to form self-aligned suicide and contact regions, such contacts are commonly referred to as salicide (self-aligned silicide) contacts. Self alignment of the salicide contact may be achieved, for example, by etching through a dielectric layer to form contact regions in an underlying silicon conductor layer. After deposition of the appropriate metal layer, a treatment such as rapid thermal heating brings about formation of the metal silicide compound layer in the contact regions only, with the superfluous metal being removed. Adjacent to salicide contact layers commonly are formed dielectric spacer layers.

Salicide contacts and contact layers have become increasingly widely employed in microelectronics fabrications. The self-aligning feature and inherently low electrical resistance of the silicide materials are especially important as dimensions and ground rules have diminished. The formation of salicide contacts is not without problems, however.

For example, the unmasked dielectric layer which is adjacent to the masked salicide block etch layer prior to selective salicidation of the microelectronics fabrication must be subsequently removed prior to further processing. Customarily, silicon oxide layers are employed as salicide block etch layers. The subsequent removal of silicon oxide by chemical etching, particularly in narrow gaps, may result in damage to other silicon oxide layers, in particular gap filling silicon oxide layers in shallow isolation trenches, field oxide isolation layers and the like.

It is thus towards the goal of improved methods for removing dielectric material employed within microelectronics fabrications with closely spaced features such as employed for salicide electrical contact formation that the present invention is generally directed.

Various methods have been disclosed for employing and removing dielectric layers employed in forming salicide contacts within microelectronics fabrications.

For example, Yoo, in U.S. Pat. No. 5,573,980, discloses a method for forming self aligned silicide contacts in a silicon integrated circuit without stringers or stray silicide conductor paths. The method employs a thin polysilicon layer patterned so as to cover only the contact region desired. A metal layer such as titanium is then deposited over the silicon and the titanium silicide contact layer formed, the excess titanium then being etched away.

Further, Naem, in U.S. Pat. No. 5,780,349, discloses a method for forming self-aligned gate, source and drain cobalt silicide contacts to MOSFET devices. The method employs ion implantation of a dopant into the patterned polysilicon layer first formed over the gate, source and drain electrode areas, followed by thermal annealing to disperse and activate the dopant. Then a layer of cobalt is formed over the patterned polysilicon layer and a second ion implantation with heavy ions employed to mix the cobalt and silicon materials at their interface. A second rapid thermal annealing is then employed to form the cobalt silicide salicide contacts.

Still further, Huang, in U.S. Pat. No. 5,863,820, discloses a method for forming contacts to memory and logic circuits on the same chip, employing salicide contacts for the logic circuits and SAC contacts to the memory circuits. The method employs a protective coating of silicon oxide to mask the memory device portion of the chip so that the salicide contacts may be formed on the logic device portion of the chip. Then, while the logic device portion is protected, the memory device portion is provided with self-aligned contacts (SAC).

Finally, Pan et al., in U.S. Pat. No. 5,869,396, disclose a method for forming a self-aligned polycide gate electrode within a field effect transistor (FET) wherein the metal silicide portion of the gate electrode does not encroach upon adjacent device areas. The method employs a patterned polysilicon layer whose surface is exposed by planarizing an overlying blanket insulator layer. The exposed patterned polysilicon layer is then covered with a patterned metal silicide layer, so as to form a polycide gate electrode.

Desirable in the art of microelectronics fabrication are additional methods for forming and removing dielectric layers employed in forming salicide contacts selectively and with attenuated degradative effects.

It is towards these goals that the present invention is generally and more specifically directed.

SUMMARY OF THE INVENTION

It is a first object of the present invention to provide a method for complete removal of dielectric layers from selected regions of substrates employed within microelectronics fabrications.

It is a second object of the present invention to provide a method in accord with the first object of the present invention, where the unmasked dielectric layer outside the salicide block etch layer is readily removed selectively between closely spaced structures with attenuated degradation of the microelectronics fabrication.

It is a third object of the present invention to provide a method in accord with the first method of the present invention and/or the second object of the present invention, where the method is readily commercially implemented.

In accord with the goals of the present invention, there is provided a method for removing completely dielectric layers formed upon a substrate employed within a microelectronics fabrication from regions wherein closely spaced structures such as self-aligned silicide or salicide electrical contacts have been fabricated, with attenuated degradation of the microelectronics fabrication. To practice the invention, there are first provided closely spaced structures within a substrate employed within a microelectronics fabrication. There is formed over the substrate a salicide block layer employing silicon containing glass dielectric material which may be selectively doped. There is then formed a patterned photoresist etch mask layer over the substrate. Employing the patterned photoresist etch mask layer, there is then etched the pattern of the desired salicide contact region through the salicide block layer to remove completely silicon containing dielectric block layer without degrading other features of the substrate surface, in particular the silicon oxide dielectric material formed within the shallow trench isolation layer.

The present invention may be employed to form selective regions for salicide contact fabrication on silicon substrates or silicon layers formed upon substrates employed within microelectronics fabrications including but not limited to integrated circuit microelectronics fabrications, solar cell microelectronics fabrications, charge coupled device microelectronics fabrications, ceramic substrate microelectronics fabrications and flat panel display microelectronics fabrications.

The present invention employs methods and materials which are known in the art of microelectronics fabrication, but arranged in a novel order and sequence. Therefore the method of the present invention is readily commercially implemented.

BRIEF DESCRIPTION OF THE DRAWINGS

The objects, features and advantages of the present invention are understood within the context of the Description of the Preferred Embodiments as set forth below. The Description of the Preferred Embodiments is understood within the context of the accompanying drawings, which form a material part of this disclosure, wherein:

FIG. 1 to FIG. 3 illustrate the formation upon a substrate employed within a microelectronics fabrication of a silicon containing dielectric salicide block layer with improved properties.

FIG. 4 to FIG. 6 illustrate the formation upon a silicon substrate employed within an integrated circuit microelectronics fabrication of a doped silicon oxide salicide block layer with improved properties for subsequent formation of self-aligned titanium suicide contacts because of complete removal of the dielectric layer with attenuated degradation of the integrated circuit microelectronics fabrication.

DESCRIPTION OF THE PREFERRED EMBODIMENTS

The present invention provides a method for forming upon a silicon substrate employed within a microelectronics fabrication a silicon containing dielectric salicide block layer with improved properties of subsequent complete removal with attenuated degradation of the microelectronics fabrication.

First Preferred Embodiment

Figure 1:
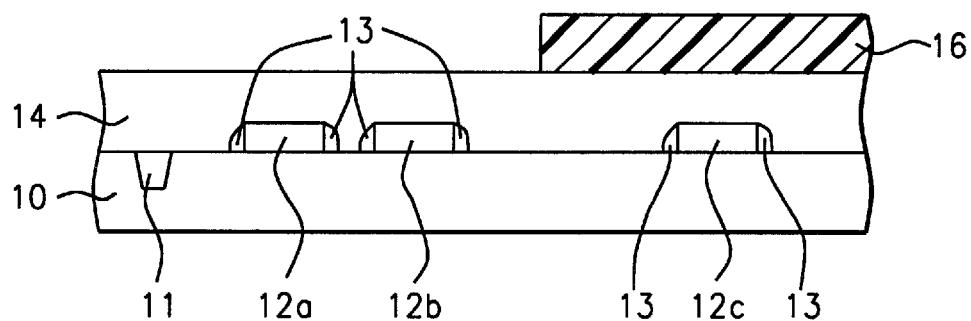
FIG. 1, FIG. 2 and FIG. 3 are directed towards a general embodiment of the present invention which constitutes a first preferred embodiment of the present invention.
Figure 2:
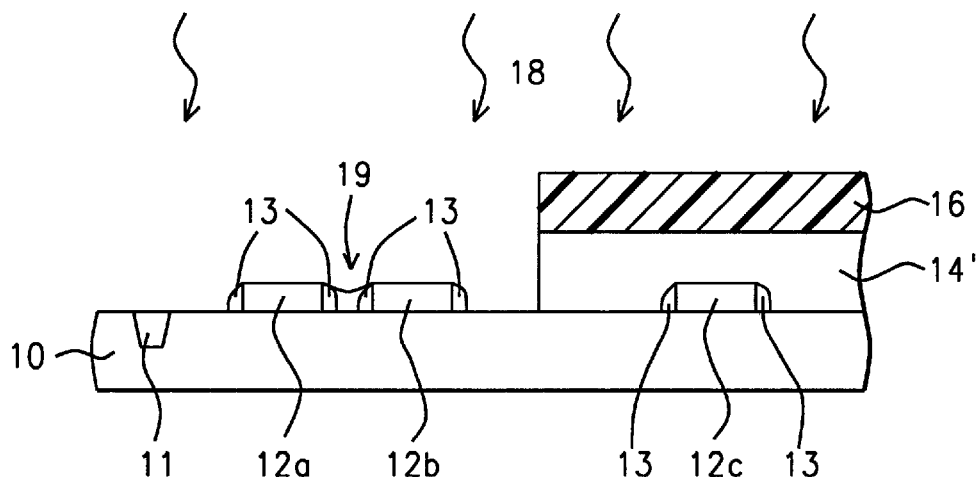
Figure 3:
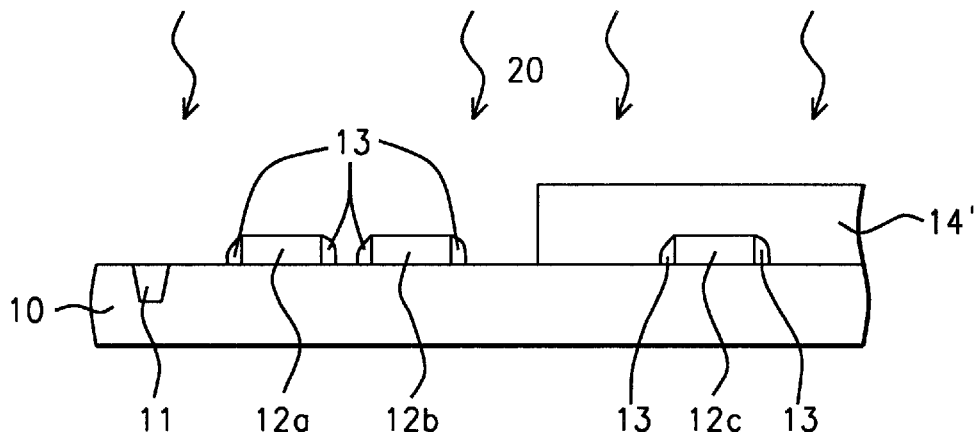

Referring now to FIG. 1 to FIG. 3, there is shown a series of schematic cross-sectional diagrams illustrating the results of forming selectively upon a silicon substrate employed within a microelectronics fabrication, and having formed therein a shallow isolation trench filled with silicon oxide, a dielectric layer with improved properties in accord with a general embodiment of the present invention which constitutes a first preferred embodiment of the present invention. FIG. 1 s a schematic cross-sectional diagram of a microelectronics fabrication at an early stage in its fabrication.

Shown in FIG. 1 is a silicon substrate 10 employed within a microelectronics fabrication having formed within it a shallow trench isolation (STI) trench 11 filled with dielectric material, closely spaced adjacent patterned transistor gates 12a and 12b with dielectric spacers 13, and a companion isolated patterned transistor gate a 12c with dielectric spacers 13. Formed over the silicon substrate and features is a salicide block dielectric layer employing a doped silicon containing dielectric material 14. Formed over the substrate is a patterned photoresist etch mask layer 16.

With respect to the silicon substrate 10 shown in FIG. 1, the silicon substrate 10 may be the silicon substrate itself employed within the microelectronics fabrication, or alternatively the silicon substrate 10 may be comprised of any of several silicon microelectronics layers formed over the substrate employed within a microelectronics fabrication. Preferably the silicon substrate 10 is a (100) orientation single crystal silicon semiconductor substrate of either p- or n-type doping.

With respect to the shallow trench isolation (STI) trench 11 filled with dielectric material, the shallow isolation trench 11 is formed within the silicon substrate 10 employing methods which are known in the art of microelectronics fabrication. Preferably the shallow isolation trenches are filled with a silicon oxide dielectric material formed employing high density plasma chemical vapor deposition (HDP-CVD) or low pressure chemical vapor deposition (LPCVD) followed by densification from thermal annealing at temperature s from about 800 to about 1200 degrees centigrade.

With respect to the patterned transistor gates 12a, 12b and 12c shown in FIG. 1, the patterned transistor gates 12a, 12b and 12c are formed employing microelectronics materials chosen from the group consisting of microelectronics conductor materials, microelectronics semiconductor materials and microelectrorics dielectric materials. The transistor gates 12a, 12b and 12c are formed and patterned employing methods as are known in the art of microelectronics fabrication. Preferably the transistor gates are formed employing polycrystalline silicon gate electrode layers with or without metal silicide layers and silicon oxide dielectric gate insulating layers. With respect to the dielectric spacers 13 shown in FIG. 1, the dielectric spacers 13 are preferably silicon oxide or silicon nitride dielectric materials formed employing methods and materials as are known in the art of microelectronics fabrication.

With respect to the doped silicon containing dielectric layer 14 shown in FIG. 1, the doped silicon containing dielectric layer 14 is formed employing methods as are known in the art of microelectronics fabrication including but not limited to plasma enhanced chemical vapor deposition (PECVD) methods, sub-atmospheric chemical vapor deposition (SACVD) methods, high density plasma chemical vapor deposition (HDP-CVD) methods, physical vapor deposition (PVD) sputtering methods, spin-on-glass (SOG) and spin-on-polymer (SOP) methods. Preferably the silicon containing dielectric layer 14 is a doped silicon oxide dielectric material formed employing plasma enhanced chemical vapor deposition (PECVD) in accord with the following process conditions: (1) tetra-ethyl-ortho-silicate (TEOS) silicon source gas at a flow rate of about 1 to about 10,000 standard cubic centimeters per minute (sccm); (2)

triethyl boron and/or triethylphosphate dopant gases at a flow rate of from about 0.5 to about 1000 standard cubic centimeters per minute (sccm) total; (3) ozone or oxygen gas at a flow rate of from about 1000 to about 10,000 standard cubic centimeters per minute (sccm); (3) pressure from about 0.1 to about 600 torr; (4) temperature of from about 100 to about 600 degrees centigrade; (5) power from about 200 to about 2500 watts; (6) radio frequency from 350 kiloHertz (kHz) to 13.56 megaHertz (mHz); and (7) nitrogen gas or inert gases helium or argon at a flow rate of about 1000 to about 20,000 standard cubic centimeters per minute (sccm). The processing conditions above may also be applied for the formation of doped silicon oxide dielectric layer 14 employing SACVD method with the exclusion of radiofrequency power.

With respect to the patterned photoresist etch mask layer 16 shown in FIG. 1, the patterned photoresist etch mask layer 16 is formed employing methods and materials as are conventionally employed in photolithographic fabrication of microelectronics fabrications.

Referring now more particularly to FIG. 2, there is shown a schematic cross-sectional diagram illustrating the results of further processing of the microelectronics fabrication whose schematic cross-sectional diagram is shown in FIG. 1. Shown in FIG. 2 is a microelectronics fabrication otherwise equivalent to the microelectronics fabrication shown in FIG. 1, but where there has been etched away selectively the doped silicon containing glass dielectric layer 14 over the shallow isolation trench 11 and adjacent gate electrodes regions 12b and 12a, employing the patterned photoresist etch mask layer 16 and an etching environment 18. A residual amount 19 of salicide block layer may be left, particularly within narrow spaces.

With respect to the etching environment 18 shown in FIG. 1, the etching environment 18 is a dry plasma reactive ion etching environment. Preferably the dry plasma reactive ion etching environment 18 employs the following process conditions: (1) etching gases comprising two or more of the following gases: tetrafluoromethane, perfluorobutene, hexafluoroethane, tetrafluoroethylene, trifluoromethane, carbon monoxide, and oxygen with argon inert gas at a total flow rate of about 5 to about 5000 standard cubic centimeters per minute; (2) helium carrier gas at a flow rate of from about 200 to about 10,000 standard cubic centimeters per minute (sccm); (3) temperature from about 20 to about 550 degrees centigrade; (4) power from about 50 to about 4000 watts; (5) frequency 13.56 megahertz (mHz); and (6) pressure of from about 5 to about 2000 milliTorr.

Referring now more particularly to FIG. 3, there is shown a schematic cross-sectional diagram illustrating the results of further processing of the microelectronics fabrication whose schematic cross-sectional diagram is shown in FIG. 2. Shown in FIG. 3 is a microelectronics fabrication otherwise equivalent to the microelectronics fabrication shown in FIG. 2, but where there has treated the substrate to remove the dielectric layer residue 19 by treatment with a second etching environment 20. Subsequently the patterned photoresist etch mask layer 16 has been stripped away to prepare the silicon substrate for subsequent deposition of metal for salicide formation at the exposed conductor regions 12a and 12b. Preferably the patterned photoresist etch mask layer 16 is stripped followed by the removal of the dielectric layer residue 19 by means of treatment to the second etching environment 20.

With respect to the second etching environment 20 shown in FIG. 3, the second etching environment 20 is a vapor etching environment. Preferably the vapor etching environment employs anhydrous hydrogen fluoride (HF) in an FSI Excalibur vapor etching system commercially available from FSI International, 322 Lake Hazeltine Drive, Chaska, Minn., USA 55318-1096, or alternatively from DNS (Dai-Nippon Screen), Teranouchi-agaru 4, Horikawa-dori, Kamigyo-ku, Kyoto 602, Japan With respect to the preferred vapor etching environment 20, the preferred vapor etching environment employs the following process conditions: (1) temperature from about 40 to about 100 degrees centigrade; (2) hydrofluoric acid temperature of from about 24 to about 60 degrees centigrade; (3) anhydrous hydrogen fluoride (HF) temperature of from about 24 to about 60 degrees centigrade, (4) chamber exhaust pressure of from about 50 to about 250 pascals (pa); (5) nitrogen carrier gas at a gas flow rate of from about 2 to about 100 liters per minute (l/min).

The selectivity of the anhydrous HF etch environment is greater than 500:1 with respect to the etch rate of the B-P doped silicon oxide dielectric material residue found between closely spaced surface features compared to the undoped silicon oxide dielectric material filling the STI trench, which is formed employing HDP-CVD method or LPCVD method followed by thermal annealing for densification.

The first embodiment of the present invention provides suitable regions on a substrate employed within a microelectronics fabrication for forming salicide electrical contacts with improved properties, due to complete removal of residual silicon containing dielectric material employed as a salicide block layer, with attenuated degradation to other portions of the fabrication. In particular, since there is no need to remove completely the doped silicon oxide block layer dielectric material, the susceptible silicon oxide dielectric material in the shallow trench isolation (STI) regions is not attacked or otherwise damaged.

Second Preferred Embodiment

Figure 4:
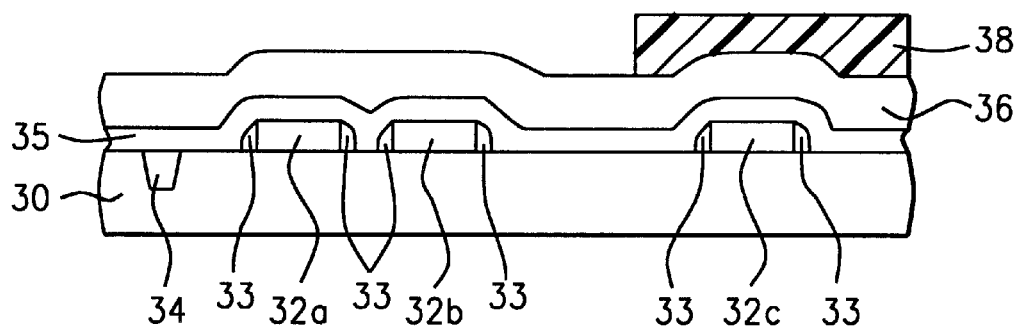
FIG. 4, FIG. 5 and FIG. 6 are directed towards a more specific embodiment of the present invention which constitutes a second preferred embodiment of the present invention.
Figure 5:
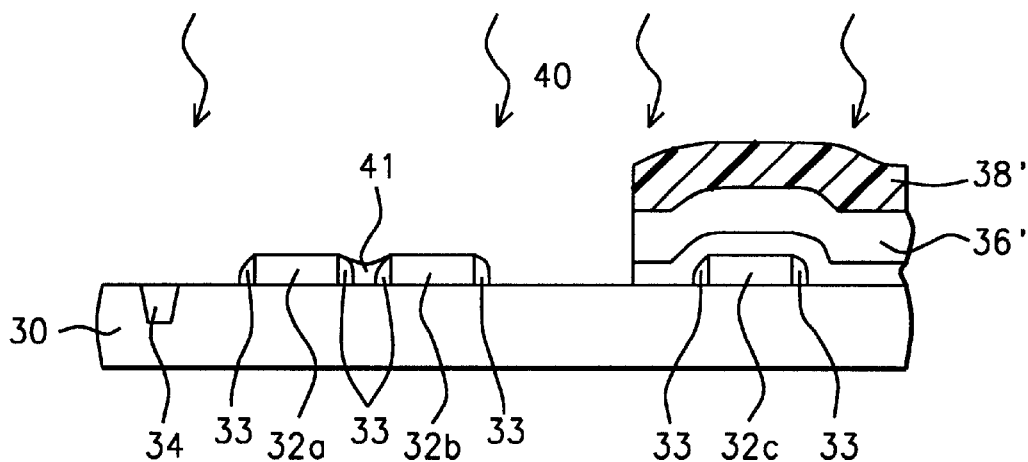
Figure 6:
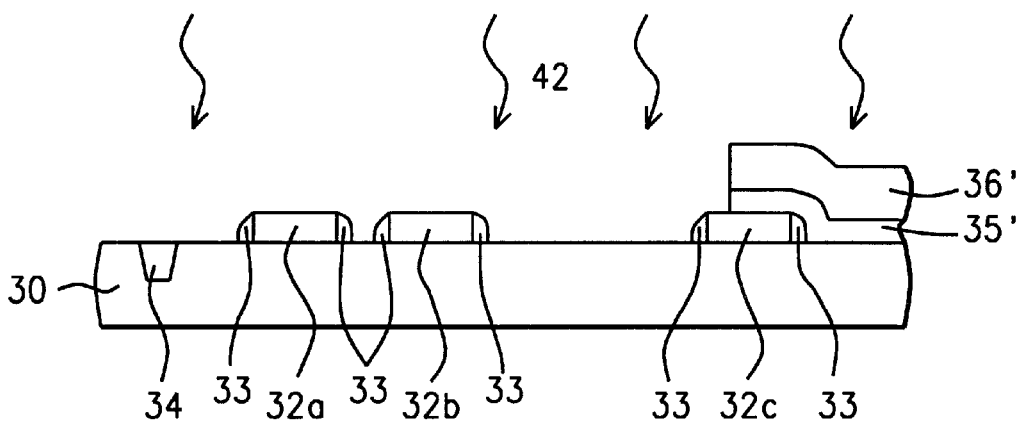

Referring now more particularly to FIG. 4 to FIG. 6, there is shown a series of schematic cross-sectional diagrams illustrating the formation upon a silicon substrate employed within an integrated circuit microelectronics fabrication a doped silicon oxide dielectric salicide block layer with improved properties for forming subsequently titanium silicide self-aligned electrical contacts upon the silicon substrate, in accord with a more specific embodiment of the present invention which constitutes a second preferred embodiment of the present invention. FIG. 4 is a schematic cross-sectional diagram of an integrated circuit microelectronics fabrication at an early stage in its fabrication in accord with the second preferred embodiment of the present invention.

Shown in FIG. 4 is a silicon substrate 30 within which is formed an integrated circuit comprising a number of closely spaced patterned transistor gates 32a, 32b and 32c, and a shallow trench isolation (STI) trench region 34 filled with a silicon oxide dielectric material. Formed on the sides of the patterned transistor gates 32a, 32b and 32c are dielectric spacers 33. Formed over the substrate is a dielectric salicide block layer comprised of an undoped dielectric layer 35 and a doped dielectric layer 36. Preferably the undoped dielectric layer 35 is of lesser thickness than the doped dielectric layer 36. Formed over the dielectric salicide block layer is a patterned photoresist etch mask layer 38.

With respect to the silicon substrate 30 shown in FIG. 4, the silicon substrate 30 is equivalent or analogous to the silicon substrate 10 shown in FIG. 1 of the first preferred embodiment of the present invention.

With respect to the microelectronics transistor gates 32a, 32b and 32c shown in FIG. 4, the microelectronics transistor gates 32a, 32b and 32c are analogous or equivalent to the transistor gates 12a, 12b and 12c shown in FIG. 1 of the first preferred embodiment of the present invention. Preferably the microelectronics transistor gates 32a, 32b and 32c are formed employing polycrystalline silicon semiconductor material as gate electrode layers with or without metal silicide layers and silicon oxide dielectric material as gate insulation layers. With respect to the dielectric spacers 33 shown in FIG. 4, the dielectric spacers are analogous or equivalent to the dielectric spacers 13 shown in FIG. 1 of the first preferred embodiment of the present invention.

With respect to the shallow trench isolation (STI) trench 34 shown in FIG. 4, the shallow trench isolation trench 34 is analogous or equivalent to the shallow trench isolation trench 11 shown in FIG. 1 of the first preferred embodiment of the present invention With respect to the doped silicon oxide dielectric salicide etch block layer 36 shown in FIG. 4, the doped silicon oxide dielectric salicide block layer 36 is analogous to the silicon containing dielectric layer shown in FIG. 1 of the first preferred embodiment of the present invention. The silicon oxide dielectric salicide block layer may be formed of a first lower sub-layer 35 of undoped silicon oxide dielectric material followed by the second upper sub-layer 36 formed employing doped silicon oxide dielectric material. Preferably the doped silicon oxide dielectric salicide block layer 36 is formed employing plasma enhanced chemical vapor deposition (PECVD) methods according to the following process conditions: (1) silicon source gas tetra-ethyl orthosilicate (TEOS) vapor or silane ($SiH_4$) gas at a flow rate of from about 10 to about 5000 milligrams per minute (mg/min); (2) dopant source gases triethylborate and/or triethylphosphate vapors from about 1 to about 1000 milligrams per minute (mg/min); (3) power from about 200 to about 2500 watts; (4) temperature from about 100 to about 600 degrees centigrade; (5) frequency from 350 kHz to 13.56 mHz; (6) helium or argon carrier gas flow rate of from about 1000 to about 20,000 standard cubic centimeters per minute (sccm). The undoped silicon oxide dielectric salicide block layer is formed employing the aforementioned process conditions excepting the addition of the dopant source gases triethylborate and triethylphosphate. The first lower sub-layer 35 of undoped silicon oxide dielectric material of the dielectric layer 36 is formed preferably to a thickness of from about 100 to about 3000 angstroms. The upper doped silicon oxide dielectric layer 36 is formed preferably to a thickness of from about 1000 to about 20,000 angstroms.

With respect to the undoped silicon oxide dielectric layer 35 and the doped silicon oxide dielectric layer 36 shown in FIG. 4, the undoped and doped silicon oxide dielectric layers 35 and 36 respectively may alternately be formed employing sub-atmospheric pressure thermal chemical vapor deposition (SACVD) method employing the same process conditions as above with the omission of the radiofrequency power input. The undoped dielectric layer 35 may act as a barrier layer towards diffusion of dopant species from the doped dielectric layer 36.

With respect to the shallow trench isolation (STI) isolation regions 34a and 34b shown in FIG. 4, the shallow trench isolation (STI) regions are formed employing methods and materials as are known in the art of semiconductor integrated circuit microelectronics fabrication. Preferably the shallow trench isolation (STI) regions are filled with a gap filling conformal silicon oxide dielectric material formed employing high density plasma chemical vapor deposition (HDP-CVD) method or low pressure chemical vapor deposition (LPCVD) method followed by densification at a temperature of from about 800 to about 1200 degrees centigrade.

With respect to the patterned photoresist etch mask layer 38 shown in FIG. 4, the patterned photoresist etch mask layer 38 is analogous or equivalent to the patterned photoresist etch mask layer shown in FIG. 1 of the first preferred embodiment of the present invention Referring now more particularly to FIG. 5, there is shown a schematic cross-sectional diagram illustrating the results of further processing of the integrated circuit microelectronics fabrication whose schematic cross-sectional diagram is shown in FIG. 4 in accord with the second preferred embodiment of the present invention. Shown in FIG. 5 is an integrated circuit microelectronics fabrication otherwise equivalent to the integrated circuit microelectronics fabrication shown in FIG. 4, but where there has been etched the pattern of the patterned photoresist etch mask 38 into the undoped silicon oxide dielectric salicide block layer 35 and the doped silicon oxide dielectric salicide block layer 36 employing a subtractive etching environment 40. Depending on the degree of over-etching performed, a residual amount 41 of the dielectric layer 35 may be still present in closely spaced regions. The residual amount 41 may also contain material from both undoped dielectric layer 35 and doped dielectric layer 36.

With respect to the subtractive etching environment 40 shown in FIG. 5, the subtractive etching environment 40 is analogous or equivalent to the subtractive etching environment 18 shown in FIG. 2 of the first preferred embodiment of the present invention.

Referring now more particularly to FIG. 6, there is shown a schematic cross-sectional diagram illustrating the results of further processing of the integrated circuit microelectronics fabrication whose schematic cross-sectional diagram is shown in FIG. 5 in accord with the second preferred embodiment of the present invention. Shown in FIG. 6 is an integrated circuit microelectronics fabrication otherwise equivalent to the integrated circuit microelectronics fabrication shown in FIG. 5, but where there has been further etched the substrate in a second etching environment 42 to completely remove residual material from dielectric layers 35 and 36, followed by stripping of the patterned photoresist etch mask layer 38, to prepare the substrate for eventual formation of self-aligned metal silicide electrical contacts, on microelectronics features 32a and 32b, not shown in FIG. 6.

With respect to the second etching environment 42 shown in FIG. 6, the second etching environment 42 is equivalent or analogous to the second etching environment 20 shown in FIG. 3 of the first preferred embodiment of the present invention .The selectivity of the anhydrous hydrogen fluoride etching environment 42 is greater than 10:1 with respect to the etch rate of the undoped silicon oxide dielectric material formed between closely spaced gates and the etch rate of the silicon oxide dielectric material filling the shallow trench isolation (STI) trench, which is formed employing HDP-CVD method or LPCVD method followed by thermal annealing for densification.

The second preferred embodiment of the present invention provides a method for complete removal of silicon oxide dielectric material employed as a salicide block layer prior to selective formation of self aligned metal silicide electrical contacts on polysilicon gate electrodes. This is accomplished with attenuated degradation of other features of the integrated circuit microelectronics fabrication. In particular, since there is no need to remove completely the undoped silicon oxide block layer material, the susceptible silicon oxide dielectric material in the STI regions is not partially etched away or otherwise damaged.

As is understood by a person skilled in the art, the first preferred and second preferred embodiments of the present invention are illustrative of the present invention rather than limiting of the present invention. Revisions and modifications may be made to materials, structures and dimensions through which is provided the preferred embodiments of the present invention while still providing embodiments which are within the spirit and scope of the present invention.

What is claimed is:

1. A method for removing a dielectric layer, formed within a substrate employed within a microelectronics fabrication, from regions whereupon closely-spaced features may be formed comprising:

providing a substrate employed within a microelectronics fabrication selected from the group consisting of:
integrated circuits microelectronics fabrications;
charge coupled device microelectronics fabrications;
solar cell microelectronics fabrications;
ceramic substrate microelectronics fabrications;
radiation emission microelectronics fabrications; and
flat panel display microelectronics fabrications; and
having therein or thereon microelectronics layer features closely spaced and formed from materials selected from the group consisting of:
microelectronics conductor materials;
microelectronics semiconductor materials; and
microelectronics dielectric materials;

forming over the substrate a silicon containing dielectric layer formed from silicon oxide material which may be selectively doped employing methods consisting of:
plasma enhanced chemical vapor deposition (PECVD); and
sub-atmospheric pressure thermal chemical vapor deposition (SCVD);

forming over the dielectric layer a patterned photoresist etch mask layer;

etching selectively through the dielectric layer regions wherein salicide electrical contacts are to be formed, employing a dry plasma etching environment in a gas composition consisting of two or more reactive gases selected from the group consisting of:
tetrafluoromethane;
perfluorobutene;
hexafluoroethane;
tetrafluoroethylene;
trifluoromethane;
oxygen; and
carbon monoxide; and etching in a second etching environment employing anhydrous hydrogen fluoride (HF) gas the substrate, to remove completely residues prior to salicide electrical contact formation, wherein the selective etch rate ratio of doped silicon oxide dielectric layer material is greater than 500:1 compared to the etch rate for the undoped silicon oxide dielectric layer material.

2. A method for removing a doped silicon oxide dielectric layer formed selectively and employed, upon a silicon substrate employed within a semiconductor integrated circuit microelectronics fabrication as a salicide block layer, regions whereupon self-aligned metal silicide (or salicide) electrical contacts may be formed comprising:

providing a silicon substrate having formed therein closely spaced microelectronics layer features;

forming over the silicon substrate a doped silicon oxide dielectric salicide block layer;

forming over the doped silicon oxide dielectric salicide block layer a patterned photoresist etch mask layer;

etching selectively through the doped silicon oxide dielectric salicide block layer employing the patterned photoresist etch mask layer and a first etching environment to expose the polysilicon gate electrodes of the field effect transistors selected for metal silicide formation; and etching the silicon substrate in a second etching environment to completely remove residues prior to metal deposition to form metal silicide electrical contacts with improved properties.

3. The method of claim 2 further comprising:
forming selective regions with silicon regions for metal silicide electrical contacts with attenuated degradation of adjacent regions such as shallow trench isolation (STI) regions.

4. The method of claim 2 wherein the silicon substrate is a silicon single crystalline substrate of (100) orientation of either p- or n-type doping.

5. The method of claim 2 wherein the closely spaced microelectronics layer features are formed of polycrystalline silicon semiconductor material.

6. The method of claim 2 wherein the silicon oxide dielectric salicide block layer is formed employing plasma enhanced chemical vapor deposition (PECVD) method.

7. The method of claim 6 wherein the silicon oxide dielectric salicide block layer may be formed as two sub-layers consisting of:
an undoped first sub-layer; and
a doped second sub-layer.

8. The method of claim 7 wherein the first sub-layer of undoped silicon oxide dielectric material is formed to a thickness of from about 100 to about 3000 angstroms.

9. The method of claim 2 wherein the first etching environment is a dry plasma etching environment formed of two or more reactive gases chosen from:
tetrafluoromethane;
perfluorobutene;
hexafluoroethane;
tetrafluoroethylene;
trifluoromethane;
oxygen; and
carbon monoxide.

10. The method of claim 2 wherein the second etching environment employs anhydrous hydrogen fluoride (HF).

11. The method of claim 2 wherein the metal silicide compound is selected from the group consisting of:
titanium silicide;
cobalt silicide; and
nickel silicide.

12. The method of claim 1 further comprising:
forming selective regions for salicide electrical contact formation with attenuated degradative effects on the microelectronics fabrication.

13. The method of claim 1 wherein the patterned microelectronics layer features are formed from materials selected from the group composed of:
microelectronics conductor materials;
microelectronics semiconductor materials; and
microelectronics dielectric materials.

* * * * *